(12) United States Patent
Chiang et al.

(10) Patent No.: US 12,027,569 B2
(45) Date of Patent: Jul. 2, 2024

(54) DUAL-SIDED IMAGING THIN FILM DISPLAY STRUCTURE

(71) Applicants: INTERFACE TECHNOLOGY (CHENGDU) CO., LTD., Chengdu (CN); INTERFACE OPTOELECTRONICS (SHENZHEN) CO., LTD., Shenzhen (CN); GENERAL INTERFACE SOLUTION LIMITED, Miaoli County (TW)

(72) Inventors: Che Wen Chiang, Shenzhen (CN); Po Lun Chen, Shenzhen (CN)

(73) Assignees: Interface Technology (ChengDu) Co., Ltd., Chengdu (CN); Interface Optoelectronics (Shenzhen) Co., Ltd., Shenzhen (CN); General Interface Solution Limited, Miaoli County (TW)

( * ) Notice: Subject to any disclaimer, the term of this patent is extended or adjusted under 35 U.S.C. 154(b) by 519 days.

(21) Appl. No.: 17/488,742

(22) Filed: Sep. 29, 2021

(65) Prior Publication Data
US 2023/0068076 A1    Mar. 2, 2023

(30) Foreign Application Priority Data

Aug. 30, 2021   (CN) .......................... 202111005388.0

(51) Int. Cl.
| | |
|---|---|
| *H01L 27/15* | (2006.01) |
| *G02F 1/01* | (2006.01) |
| *G02F 1/1335* | (2006.01) |
| *H01L 33/60* | (2010.01) |
| *H01L 33/62* | (2010.01) |
| *G02B 5/30* | (2006.01) |

(52) U.S. Cl.
CPC .......... *H01L 27/156* (2013.01); *G02F 1/0136* (2013.01); *G02F 1/133509* (2013.01); *G02F 1/133528* (2013.01); *G02F 1/133536* (2013.01); *G02F 1/133555* (2013.01); *H01L 33/60* (2013.01); *H01L 33/62* (2013.01); *B32B 2307/42* (2013.01); *G02B 5/3025* (2013.01)

(58) Field of Classification Search
None
See application file for complete search history.

(56) References Cited

U.S. PATENT DOCUMENTS

2003/0231266 A1* 12/2003 Ma .................... A61N 1/3752
349/115

* cited by examiner

*Primary Examiner* — Feifei Yeung Lopez
(74) *Attorney, Agent, or Firm* — Rosenberg, Klein & Lee

(57) ABSTRACT

A dual-sided imaging thin film display structure is provided, comprising a light source, a reflective polarizing element, a basing layer and a linear polarizing element. The reflective polarizing element is disposed on a front surface of the light source, the basing layer is disposed on a back surface of the light source, and the linear polarizing element is further disposed behind the basing layer. A transmission axis of the reflective polarizing element and that of the linear polarizing element are orthogonal, such that a light beam emitted from the light source passes through the reflective polarizing element to form a front image, be reflected by the reflective polarizing element, and passes through the linear polarizing element to form a back image. By employing the present invention, it achieves to provide dual-sided images and interferences between the images are suppressed to obtain superior imaging quality and resolution.

22 Claims, 6 Drawing Sheets

DUAL-SIDED IMAGING THIN FILM DISPLAY STRUCTURE

BACKGROUND OF THE INVENTION

This application claims priority of Application No. 202111005388.0 filed in Mainland China on 30 Aug. 2021 under 35 U.S.C. § 119; the entire contents of all of which are hereby incorporated by reference.

FIELD OF THE INVENTION

The present invention is related to a screen display structure. More particularly, it is related to a thin film display structure which is capable of providing individual image on dual sides and is improved to suppress interferences between the images and obtain superior imaging quality and resolution.

DESCRIPTION OF THE PRIOR ART

As we all know, a light-emitting diode (LED) is a certain type of backlight that provides high luminance. And therefore, most of the electronic products nowadays, including lamps, smart phones, and smart TVs, use LEDs to serve as backlight sources. Since LEDs show a lot of advantages in giving luminance, saving power consumption, providing visible angle and refreshing rates, the existing technologies are able to employ with the LED thin film process techniques to fabricate a LED thin film display device that is much thinner in thickness, and also provide images which are much more luminous and clearer than before.

Generally, the existing LED thin film display device is a display device composed of a great number of arranged light-emitting diodes. The LED thin film display device can be easily driven by low-voltage scan and is advantageous of low power consumption, fabrication cost, failure rate, as well as long service life, high luminance, and large visual angle and visual range. For instance, a visual angle greater than 160° can be accomplished and can be used to display a variety of texts, numbers, color images and animation messages of TV, video, VCD (Video Compact Disc), or DVD (Digital Versatile Disc). Therefore, it has been widely used for showing information as in the imaging applications of display devices, such as electronic billboards, smart public transportations, and so on.

Normally, a common LED thin film display device provides a single-sided image, which means that it only shows information on a single surface. However, with the continuous evolution of display process technologies, the LED thin film display device that can provide dual-sided images has been rapidly developing in recent years. As known, a dual-sided imaging LED thin film display device uses more than two screens which are in stacked structure, such that information can be shown on both its front surface and back surface. For example, a dual-sided imaging LED thin film display device is commonly used in a central region of a shopping mall for people from both sides to view its shown information. Besides, it can also be used as a LED glass wall screen, which provides dual-sided images for both people inside the wall screen and outside the wall screen to view. And furthermore, there are more scenarios in which the dual-sided imaging LED thin film display device can be applied for sure, such as smart public transportation. And therefore, in such application, people outside the transportation are able to read the advertisement it shows outwardly, and people inside the transportation are able to read the route information it shows inwardly.

However, what still draws our attention is that, since the current LED thin film display device must use more than two stacked screens to show dual-sided images on both surfaces, interferences between its front image and back image are unavoidable. Therefore, images become unclear, blurred and even distorted. In addition, the perspectivity and transparency of the images are lowered as well, resulting in poor observation quality of the user such that the user might fail to read the correct information.

Therefore, on account of above, to overcome the above mentioned problems, it should be obvious that there is indeed an urgent need for the professionals in the field for proposing a new and modified thin film display structure to be developed that can effectively solve the above mentioned problems occurring in the prior design. And by using such novel structure, not only the dual-sided images can be guaranteed, but also interferences between the images are suppressed and good image resolution is maintained. Hereinafter, the detailed specific implementations will be fully described in the following paragraphs.

SUMMARY OF THE INVENTION

In order to overcome the above mentioned disadvantages, one major objective in accordance with the present invention is provided for a novel thin film display structure, which is aimed to modify the existing LED thin film display device. Compared to the current techniques, the present invention adopts two different polarizing elements, which is attached to a front surface and a back surface of the light source, respectively, such that the light beam emitted from the light source contributes to form a front image and a back image for achieving the inventive effect of the present invention as showing different images on dual sides.

Another objective in accordance with the present invention is provided for a dual-sided imaging thin film display structure, in which two different polarizing elements including a reflective polarizing element and a linear polarizing element are disposed therein. The reflective polarizing element is disposed on a front surface of the light source, and the linear polarizing element is disposed on a back surface of the light source. By designing a transmission axis of the reflective polarizing element and that of the linear polarizing element are orthogonal, a light beam emitted from the light source is able to pass through the reflective polarizing element and forms a front image. And, the light beam is reflected by the reflective polarizing element, and passes through the linear polarizing element behind the light source to form a back image. As a result, the proposed thin film display device achieves in showing dual-sided images.

In addition, and yet another objective in accordance with the present invention is provided for a dual-sided imaging thin film display structure applicable to LED devices. The disclosed technical solution of the present invention can be used to effectively reduce the stray light so as to improve resolution and contrast of the dual-sided images shown by the display structure. Therefore, the conventional blurred or even distorted images are avoided. Besides, it is believed that when the proposed dual-sided imaging thin film display structure is applicable to LED devices, it can also be combined with the touch function for an even wilder application in touch sensing devices and its related fields. And therefore, it is believed that industrial efficiency and applicability of the present invention can be much more increased and improved.

As a result, for achieving the above mentioned objectives, the present invention is aimed to provide a thin film display structure which is applicable to show dual-sided images. The proposed thin film display structure comprises a light source, a reflective polarizing element, a basing layer and a linear polarizing element. The light source has a front surface and a back surface which is opposite to the front surface. The reflective polarizing element is disposed on the front surface of the light source.

The basing layer is disposed on the back surface of the light source and the basing layer includes a substrate and at least one trace configuration layer. The linear polarizing element is further disposed behind the basing layer, and a transmission axis of the reflective polarizing element and that of the linear polarizing element are orthogonal, such that a light beam emitted from the light source passes through the reflective polarizing element to form a front image. And, the light beam is reflected by the reflective polarizing element, and passes through the linear polarizing element to form a back image.

In one embodiment of the present invention, the at least one trace configuration layer can be disposed on an upper surface of the substrate, such that the at least one trace configuration layer is configured between the light source and the substrate.

Alternatively, the at least one trace configuration layer can also be disposed on a lower surface of the substrate, such that the at least one trace configuration layer is configured between the substrate and the linear polarizing element.

And yet, in a preferred embodiment of the present invention, the above mentioned at least one trace configuration layer may also comprise a first trace configuration layer and a second trace configuration layer, which are respectively disposed on an upper surface of the substrate and on a lower surface of the substrate. In such an embodiment, the first trace configuration layer is configured between the light source and the substrate, and the second trace configuration layer is configured between the substrate and the linear polarizing element. According to the present invention, the first trace configuration layer and the second trace configuration layer are allowed to have exactly the same trace distribution density, or have different trace distribution density. The present invention is definitely not limited to certain numerical value or distribution pattern of these distribution densities. Moreover, the disclosed trace configuration layer is designed to be able to provide electrical power or data input to the light source. And, the proposed trace configuration layer comprises a plurality of wires, and a material of the wires in the trace configuration layer can be configured as metal or non-metal, which are both feasible in the invention for providing a front image and a back image.

According to the technical characteristics disclosed in the present invention, in one embodiment, the light source may comprise a plurality of light-emitting diodes (LED) for emitting the light beam. The light beam includes a first polarization direction and a second polarization direction, and the first polarization direction and the second polarization direction are orthogonal. The plurality of light-emitting diodes are able to switch the first polarization direction and the second polarization direction alternatively. When the light beam in the first polarization direction is S-polarized light, the light beam in the second polarization direction is P-polarized light. Alternatively, when the light beam in the first polarization direction is P-polarized light, the light beam in the second polarization direction is S-polarized light.

Therefore, in such an embodiment, when the reflective polarizing element permits the light beam in the first polarization direction to pass through, the front image is formed by the light beam in the first polarization direction. And the back image is formed by the light beam in the second polarization direction.

On the other hand, while the reflective polarizing element permits the light beam in the second polarization direction to pass through, then the front image is formed by the light beam in the second polarization direction. And the back image is formed by the light beam in the first polarization direction. Generally, according to these foregoing embodiments, the light beam emitted from the light source firstly passes through the transmission axis of the reflective polarizing element to form the front image. Subsequently, the light beam is reflected by a reflection axis of the reflective polarizing element and then passes through the linear polarizing element to form the back image. Under such a condition, it is believed that a time difference is generated between forming the front image and forming the back image.

In one embodiment, for example, when a frame rate of the front image and the back image is greater than 120 frames per second, then the generated time difference can be controlled as being less than 0.008 second.

Considering another aspect, the light source of the present invention in another embodiment may alternatively comprise a plurality of light-emitting diodes (LED) composed of a first group of light-emitting diodes and a second group of light-emitting diodes. The light beam emitted from the first group of light-emitting diodes is in a first polarization direction, and the light beam emitted from the second group of light-emitting diodes is in a second polarization direction. The first polarization direction and the second polarization direction are orthogonal. When the light beam in the first polarization direction is S-polarized light, the light beam in the second polarization direction is P-polarized light. Alternatively, when the light beam in the first polarization direction is P-polarized light, the light beam in the second polarization direction is S-polarized light.

Therefore, in such another embodiment, the first group of light-emitting diodes and the second group of light-emitting diodes can be turned on simultaneously, such that the front image is formed by the light beam in the first polarization direction and the back image is formed by the light beam in the second polarization direction. Under such a circumstance, the front image and the back image are formed simultaneously, and obviously, no time difference will be generated between forming the front image and forming the back image.

And furthermore, regarding a variety of imaging requirements and specifications of different display devices, it is also practical to turn on either the first group of light-emitting diodes or the second group of light-emitting diodes, such that either the front image or the back image is formed.

As such, in one embodiment, when only the first group of light-emitting diodes is turned on and the reflective polarizing element permits the light beam in the first polarization direction to pass through, it is believed that the front image will be formed by the light beam in the first polarization direction.

In another embodiment, when only the first group of light-emitting diodes is turned on and yet, the reflective polarizing element permits the light beam in the second polarization direction to pass through, then the light beam in the first polarization direction contributes to form the back image.

On the contrary, when only the second group of light-emitting diodes is turned on and the reflective polarizing element permits the light beam in the second polarization direction to pass through, it is believed that the front image will be formed by the light beam in the second polarization direction.

And in one another embodiment, when only the second group of light-emitting diodes is turned on and yet, the reflective polarizing element permits the light beam in the first polarization direction to pass through, then only the back image will be formed, and the back image is formed by the light beam in the second polarization direction.

As a result, in view of the various embodiments provided above by the present invention, it is apparent that by employing two types of polarizing elements: the reflective polarizing element and the linear polarizing element, disposing the reflective polarizing element on a front surface of the light source and the linear polarizing element on a back surface of the light source, and designing their transmission axes orthogonal to each other, the light beam emitted from the light source forms a front image when passing through the reflective polarizing element. And by reflection of the reflective polarizing element, the light beam forms a back image when passing though the linear polarizing element. Therefore, the present invention achieves to provide individual image respectively on the front surface and on the back surface, and most important of all, interferences between the images are eliminated. The present invention apparently solves the above mentioned problems discussed in the prior arts.

Therefore, it is obvious that the proposed thin film display structure of the present invention adopts two different polarizing elements, each on the front and back surface of the light source, such that the light beam emitted from the light source can be utilized to form a front image and a back image independently. Due to such an inventive concept and design manners, dual-sided images are established and stray light interferences and distortion between the shown images are avoided, which indeed improves the long-standing deficiencies in the existing technologies.

In the following descriptions, the Applicant further elaborates the present invention with more detailed embodiments and accompanying drawings for these and other objectives of the present invention as being obvious to those of ordinary skill in the art after reading the following detailed description of preferred embodiments.

It is to be understood that both the foregoing general description and the following detailed description are merely exemplary and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
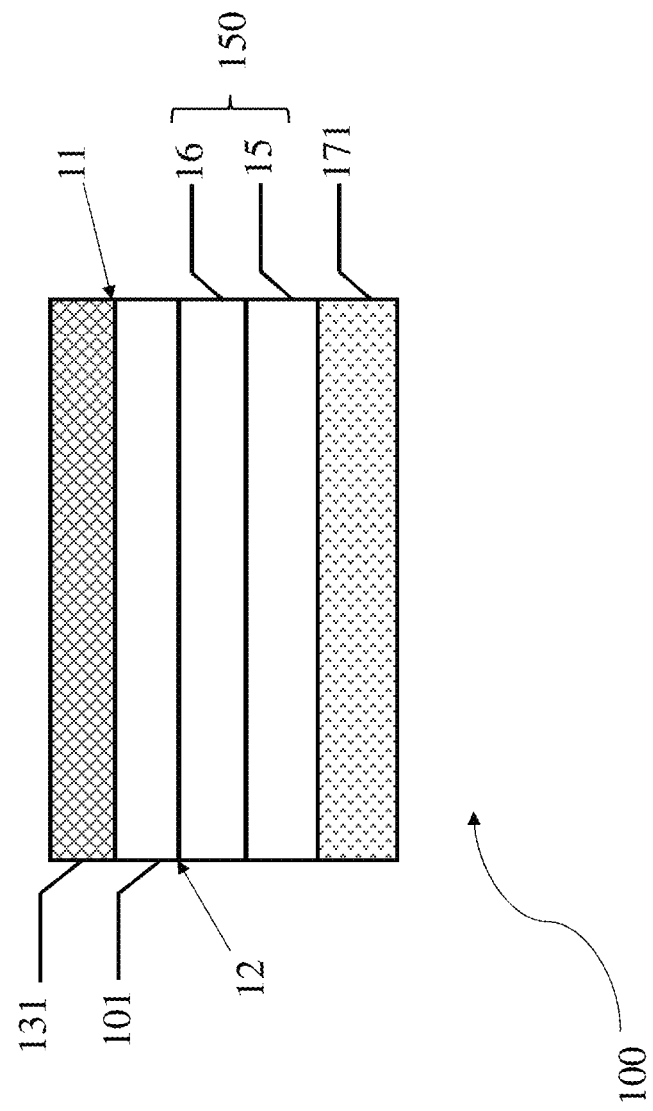
FIG. 1 schematically shows a structural diagram of a thin film display structure in accordance with a first embodiment of the present invention.

Reference will now be made in detail to the preferred embodiments of the present invention, examples of which are illustrated in the accompanying drawings. Wherever possible, the same reference numbers are used in the drawings and the description to refer to the same or like parts. In the drawings, the shape and thickness may be exaggerated for clarity and convenience. This description will be directed in particular to elements forming part of, or cooperating more directly with, methods and apparatus in accordance with the present disclosure. It is to be understood that elements not specifically shown or described may take various forms well known to those skilled in the art. Many alternatives and modifications will be apparent to those skilled in the art, once informed by the present disclosure.

The embodiments described below are illustrated to demonstrate the technical contents and characteristics of the present invention and to enable the persons skilled in the art to understand, make, and use the present invention. However, it shall be noticed that, it is not intended to limit the scope of the present invention. Therefore, any equivalent modification or variation according to the spirit of the present invention is to be also included within the scope of the present invention.

In the entire specification and claims, unless the contents clearly specify the meaning of some terms, the meaning of the article "wherein" includes the meaning of the articles "wherein" and "whereon". The meanings of every term used in the present claims and specification refer to a usual meaning known to one skilled in the art unless the meaning is additionally annotated. Some terms used to describe the invention will be discussed to guide practitioners about the invention. Every example in the present specification cannot limit the claimed scope of the invention.

The terms "substantially," "around," "about" and "approximately" can refer to within 20% of a given value or range, and preferably within 10%. Besides, the quantities provided herein can be approximate ones and can be described with the aforementioned terms if are without being specified. When a quantity, density, or other parameters includes a specified range, preferable range or listed ideal values, their values can be viewed as any number within the given range.

As described earlier in the previous prior arts, since the existing LED thin film display device fails to provide clear images due to interferences between its front image and back image, the present invention is proposed to solve these issues and discloses a modified thin film display structure. For better understanding the technical contents of the present invention, please refer to FIG. 1 first, which schematically shows a structural diagram of a thin film display structure in accordance with a first embodiment of the present invention. The thin film display structure 100 is characterized by providing dual-sided images such that a front image and a back image can be formed. As shown in FIG. 1, the thin film display structure 100 includes a light source 101, and the light source 101 includes a front surface 11 and a back surface 12 which is opposite to the front surface 11. According to the embodiment of the present invention, a reflective polarizing element 131 is disposed on the front surface 11 of the light source 101. For instance, the reflective polarizing element 131 can be adhered to the front surface 11, and the reflective polarizing element 131 can be an APF (Advance polarizer film) polarizer, which has a transmission axis and a reflection axis. A basing layer 150 is disposed on the back surface 12 of the light source 101 and includes a substrate 15 and at least one trace configuration layer 16. According to the embodiment of the present invention, the material of the substrate 15 for example, can be and yet not limited to, polyester (PET) or colorless polyimide (CPI).

Figure 2:
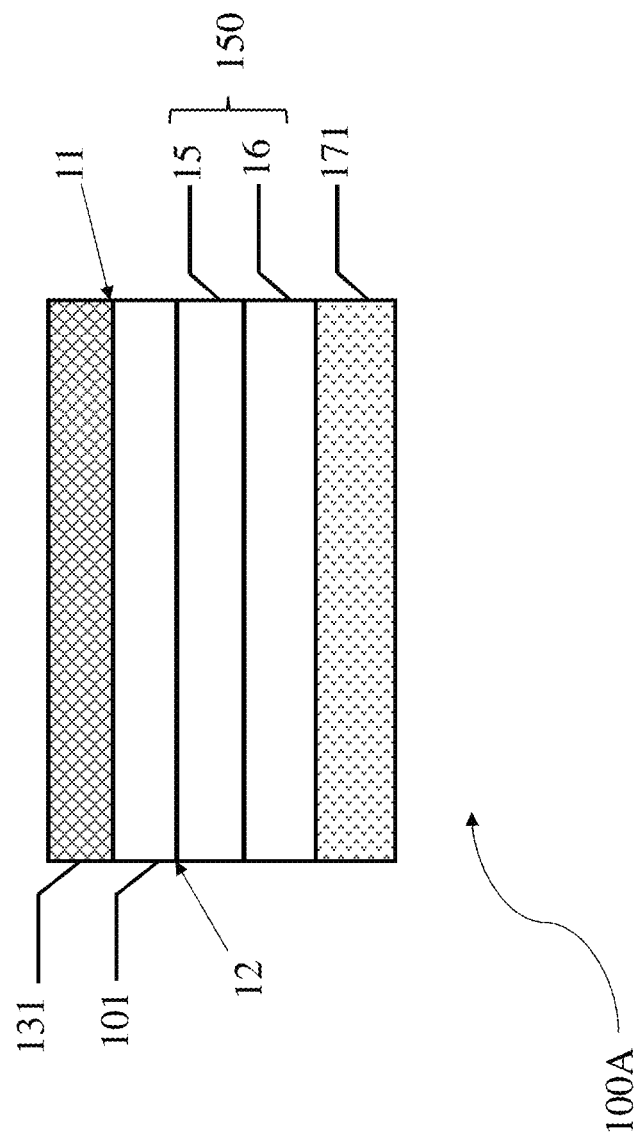
FIG. 2 schematically shows a structural diagram of a thin film display structure in accordance with a second embodiment of the present invention.
Figure 3:
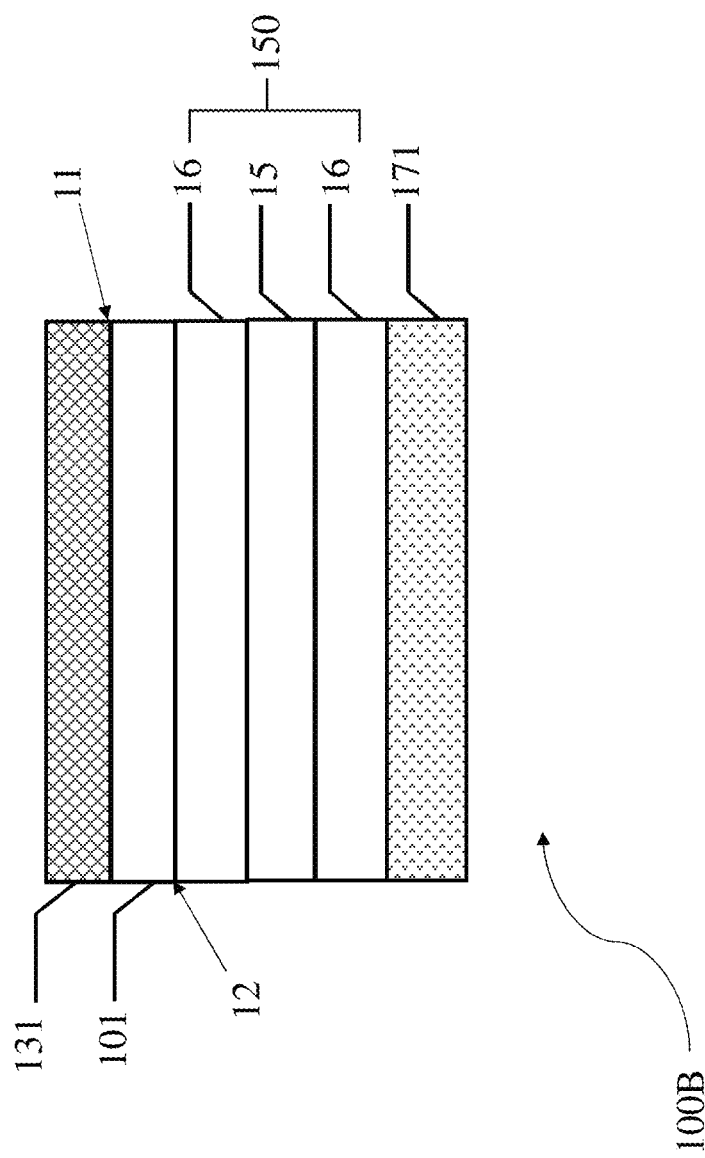
FIG. 3 schematically shows a structural diagram of a thin film display structure in accordance with a third embodiment of the present invention.

In the first embodiment, as shown in FIG. 1, the trace configuration layer 16 is disposed adjacent to the substrate 15 and disposed on an upper surface of the substrate 15, such that the trace configuration layer 16 is configured between the light source 101 and the substrate 15. In such a first embodiment, the trace configuration layer 16 is disposed on the upper surface of the substrate 15 as an illustrative example for describing the technical characteristics of the present invention. However, according to other embodiments of the present invention, the trace configuration layer 16 may also be disposed on a lower surface of the substrate 15 as shown in FIG. 2, which shows a second embodiment of the thin film display structure 100A of the present invention. And furthermore, according to a third embodiment of the present invention as shown in FIG. 3, the thin film display structure 100B may also include more than one trace configuration layer 16, which are a first trace configuration layer and a second trace configuration layer, each respectively disposed on an upper surface of the substrate 15 and on a lower surface of the substrate 15. Overall, for those who are skilled in the art and having general knowledge backgrounds, appropriate modifications and/or variations with respect to the technical contents disclosed in the present invention without departing from the spirits of the present invention are allowed. However, it is worth noting that the modifications or variations should still fall into the scope of the present invention. The present invention is certainly not restricted by the certain limited configurations disclosed in the embodiments of the present invention. In general, the trace configuration layer 16 is employed to provide electrical power or data input to the light source 101, so as to reduce the usage and density of conventional metal wires. Meanwhile, optical and/or electrical performance targets can also be accomplished.

Besides, the trace configuration layer 16 comprises a plurality of wires. Regarding materials for fabricating wires of the proposed trace configuration layer 16 in the present invention, it is evident that metal can be used. However, according to alternative embodiments of the present invention, then the wires of the trace configuration layer 16 may also be made of non-metal materials for reducing the stray light. Since the commonly known wires are usually made of metal to form metal meshes, unavoidable chemical reactions, such as oxidation, often occur on top of the metal surface when in storage or even in a manufacturing process. In addition, under some circumstances, it is even possibly to react with certain acidic substances and/or alkaline substances to generate its conductivity loss. As a result, for avoiding these foregoing issues, the present invention further proposes to use non-metal materials for fabricating wires of the trace configuration layer 16 so as to further enhance the developments and industrial applicability of the present invention. Basically, variations including numbers and positions of the trace configuration layer 16 to be disposed, and the materials for fabricating the wires thereof can be made according to different requirements by people skilled in the art, and yet should still fall into the claim scope of the present invention without departing from the spirits of the present invention.

Figure 4:
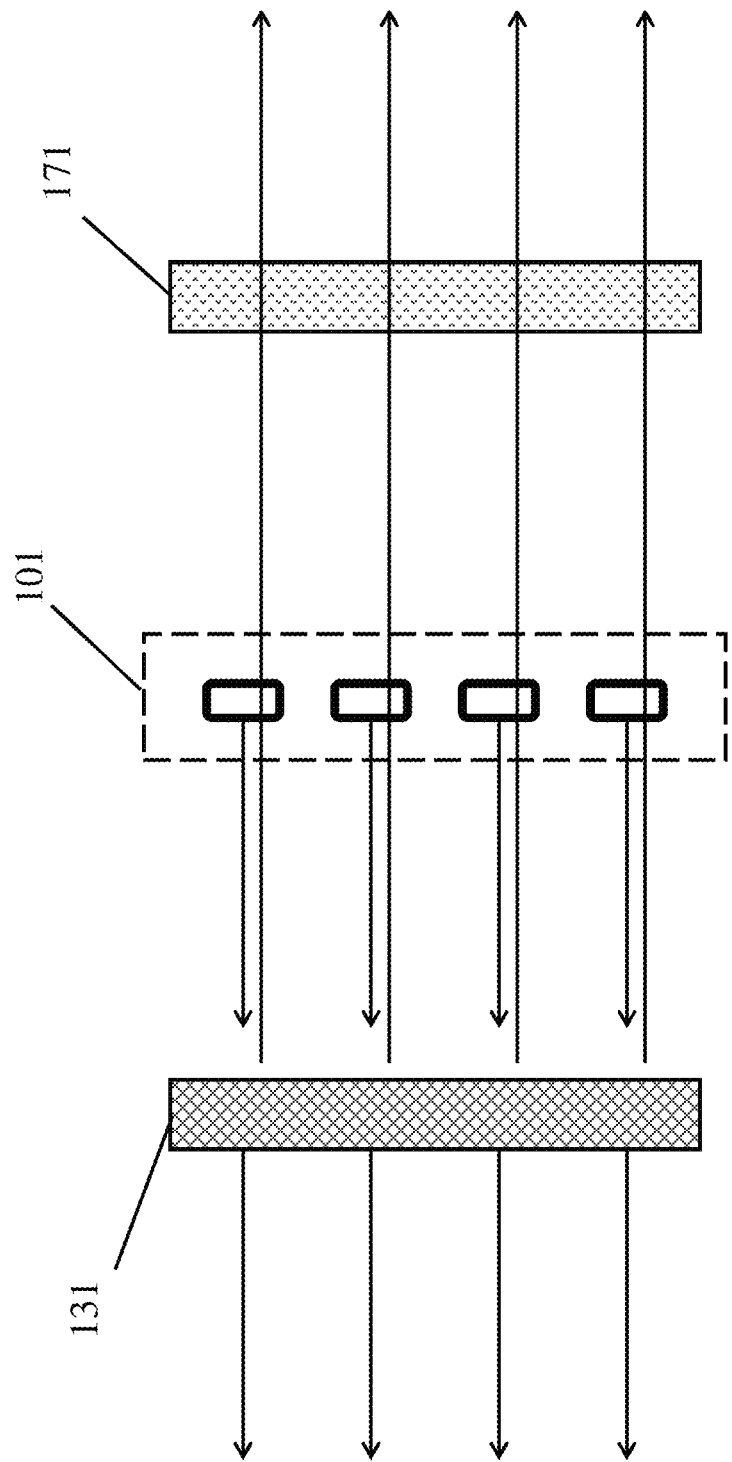
FIG. 4 schematically shows an optical imaging path in accordance with the embodiment of the present invention.

A linear polarizing element 171 is further disposed behind the basing layer 150. For example, the linear polarizing element 171 can be adhered behind the basing layer 150, and the linear polarizing element 171 can be a LP (linear polarizer), which has a transmission axis. According to the present invention, the transmission axis of the reflective polarizing element 131 and that of the linear polarizing element 171 are orthogonal. Please refer to FIG. 4 at the same time, which schematically shows an optical imaging path in accordance with the embodiment of the present invention. As illustrated, when a light beam emitted from the light source 101 passes through the transmission axis of the reflective polarizing element 131, a front image is formed on the front surface of the light source 101. In addition, the light beam is reflected by the reflection axis of the reflective polarizing element 131 and passes through the transmission axis of the linear polarizing element 171 to form a back image on the back surface of the light source 101.

Figure 5:
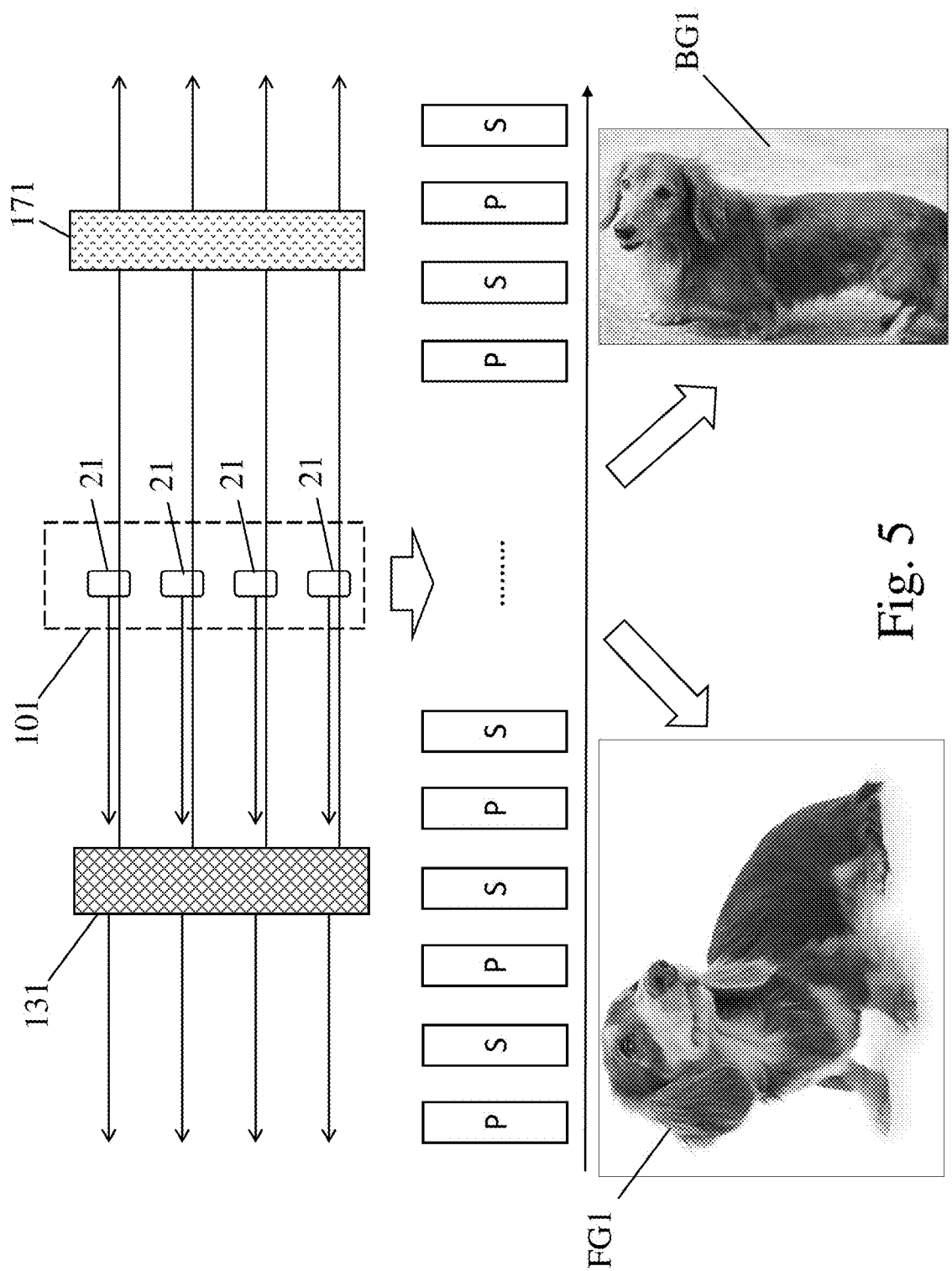
FIG. 5 shows a first schematic diagram of the present invention when employing a time-division display technique for showing dual-sided images.

To be more specific, according to the inventive concepts of the present invention, the Applicant provide at least two practical examples in the following paragraphs to implement the dual-sided imaging thin film display structure of the present invention. At first, please refer to FIG. 5, which shows a first schematic diagram of the present invention when employing a time-division display technique. In FIG. 5, the light source 101 includes a plurality of light-emitting diodes (LED) 21 for emitting the light beam, and the light beam includes a first polarization direction and a second polarization direction. The first polarization direction and the second polarization direction are orthogonal. As known, when a light beam penetrates a surface of an optical element (such as a beam splitter or polarizer) at a non-perpendicular angle, both the reflection and transmission depend on the polarization direction. Under such a circumstance, the coordinates used are defined by the plane containing the input and reflected light beams. For instance, when the polarization direction of the light is in the plane, it is defined as P-polarization. Otherwise, if the polarization direction is perpendicular to the plane, then it is defined as S-polarization. In general, each input light beam can be expressed as a vector summation of S-polarized light and P-polarized light. Therefore, according to the present invention, when the light beam in the first polarization direction is S-polarized light, then the light beam in the second polarization direction is P-polarized light. Or alternatively, when the light beam in the first polarization direction is P-polarized light, then the light beam in the second polarization direction is S-polarized light. According to the embodiment as provided in FIG. 5, the proposed plurality of light-emitting diodes 21 of the present invention are able to switch the first polarization direction and the second polarization direction alternatively. The switching mechanism, for instance, can be implemented by using a controller or switching component.

As a result, when the transmission axis of the reflective polarizing element 131 permits the light beam in the first polarization direction to pass through, then the light beam in the first polarization direction contributes to form the front image FG1. And afterwards, by reflection of the reflection axis of the reflective polarizing element 131, the light beam in the second polarization direction passes through the transmission axis of the linear polarizing element 171 to form the back image BG1.

Similarly, when the transmission axis of the reflective polarizing element 131 permits the light beam in the second polarization direction to pass through, then the light beam in the second polarization direction contributes to form the front image FG1. And afterwards, by reflection of the reflection axis of the reflective polarizing element 131, the light beam in the first polarization direction passes through the transmission axis of the linear polarizing element 171 to form the back image BG1.

To sum up, it is apparent that in such a time-division display embodiment of the present invention, the light beam emitted from the light source firstly passes through the reflective polarizing element 131 to form the front image FG1. Subsequently, the light beam is reflected by the reflective polarizing element 131 and then passes through the rear-end linear polarizing element 171, such that the back image BG1 is formed. In such an embodiment, a time difference is generated between forming the front image FG1 and forming the back image BG1. In one detailed embodiment of the present invention, when a frame rate of the front image FG1 and the back image BG1 is greater than 120 frames per second, the time difference can be controlled to be less than 0.008 second.

Figure 6:
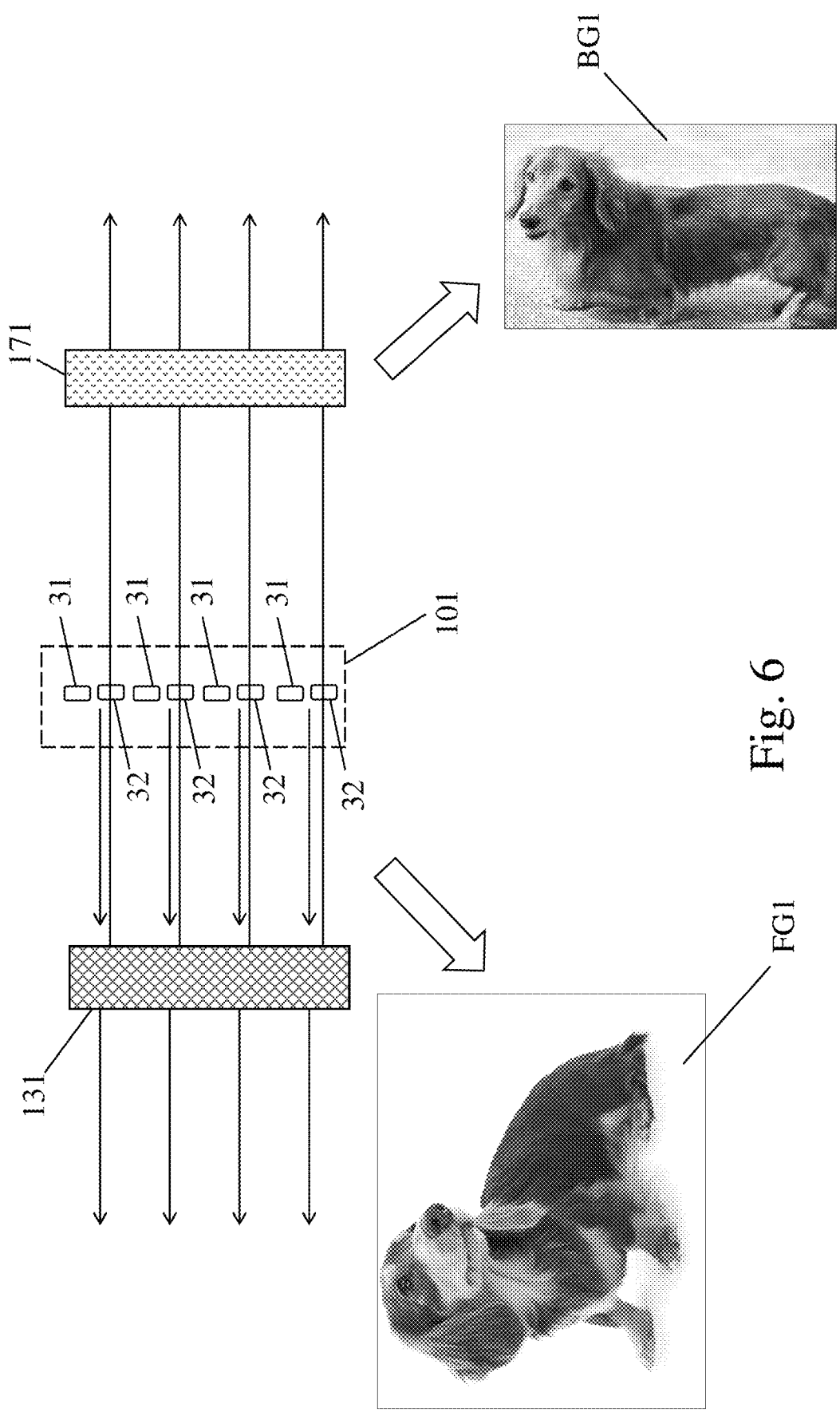
FIG. 6 shows a second schematic diagram of the present invention when employing different polarized light in different polarization directions for showing dual-sided images.

In another aspect, please refer to FIG. 6 for another embodiment of the present invention, in which FIG. 6 shows a second schematic diagram of the present invention when employing a plurality of light-emitting diodes (LED) in different polarization directions. In FIG. 6, the light source 101 includes a plurality of LEDs for emitting the light beam, and the plurality of LEDs are composed of a first group of light-emitting diodes 31 and a second group of light-emitting diodes 32. The light beam emitted from the first group of light-emitting diodes 31 is in a first polarization direction, the light beam emitted from the second group of light-emitting diodes 32 is in a second polarization direction, and the first polarization direction and the second polarization direction are orthogonal. As previously described, according to the present invention, when the light beam in the first polarization direction is S-polarized light, then the light beam in the second polarization direction is P-polarized light. Or alternatively, when the light beam in the first polarization direction is P-polarized light, then the light beam in the second polarization direction is S-polarized light. Either the first polarization direction or the second polarization direction is S-polarization or P-polarization does not restrict the claim scope of the present invention. Those skilled in the art are allowed to choose and accordingly decide the polarization direction as required, and the present invention is certainly not limited thereto.

According to the embodiment as shown in FIG. 6, the first group of light-emitting diodes 31 and the second group of light-emitting diodes 32 are turned on simultaneously, such that the front image FG1 is formed by the light beam in the first polarization direction and the back image BG1 is formed by the light beam in the second polarization direction. What differs from the embodiment in FIG. 5 is that, the front image FG1 and the back image BG1 in FIG. 6 are formed simultaneously, such that no time difference is generated between forming the front image FG1 and forming the back image BG1.

And furthermore, in view of the diversity of product devices and various imaging requirements, it is also practicable to turn on either one of the first group of light-emitting diodes 31 and the second group of light-emitting diodes 32 (meaning that, turning on both the first group of light-emitting diodes 31 and the second group of light-emitting diodes 32 at the same time is not a necessity). According to an alternative embodiment of the present invention, either the first group of light-emitting diodes 31 or the second group of light-emitting diodes 32 can be turned on, such that forming either the front image FG1 or the back image BG1 is feasible as well.

In one embodiment, when only the first group of light-emitting diodes 31 is turned on and the transmission axis of the reflective polarizing element 131 permits the light beam in the first polarization direction to pass through, in such a condition, it is believed that the light beam in the first polarization direction is able to pass through the reflective polarizing element 131, and the front image FG1 is formed by only the light beam in the first polarization direction.

In another embodiment, when only the first group of light-emitting diodes 31 is turned on and nevertheless, the transmission axis of the reflective polarizing element 131 only permits the light beam in the second polarization direction to pass through, in such a condition, only the back image BG1 is formed, in which the light beam in the first polarization direction contributes to form the back image BG1.

In one another embodiment, when only the second group of light-emitting diodes 32 is turned on and the transmission axis of the reflective polarizing element 131 permits the light beam in the second polarization direction to pass through, in such a condition, it is apparent that the light beam in the second polarization direction is able to pass through the reflective polarizing element 131, and the front image FG1 is formed by only the light beam in the second polarization direction.

And in further another embodiment, when only the second group of light-emitting diodes 32 is turned on and nevertheless, the transmission axis of the reflective polarizing element 131 only permits the light beam in the first polarization direction to pass through, in such a condition, only the back image BG1 is formed, in which the light beam in the second polarization direction contributes to form the back image BG1.

It is worth noting that, according to the technical solutions disclosed in the present invention, people who are skilled in the art or developers who are familiar with display product devices are able to make modifications and/or variations based on their practical product requirements without departing from the inventive spirits of the present invention. And the present invention claims these modifications and/or variations equally.

Therefore, in view of the various embodiments as provided above in the previous descriptions, it is obvious that the present invention is aimed to adopt two optical elements having their transmission axes mutually orthogonal. And by disposing one optical element on a front surface of the light source, and another on a back surface of the light source, dual-sided images, including a front image and a back image can be successfully formed. The disclosed optical element may be APF, LP, QWP, or other alternative optical thin film. By designing a transmission axis of one optical element on the front surface of the light source and that of another optical element on the back surface of the light source orthogonal, the present invention achieves in reducing stray lights and therefore, optical interferences between the dual-sided images are suppressed. As a result, resolution and contrast of the shown images can be greatly improved, which effectively solves the shortcomings occurring in the prior arts.

Apart from these, for complying with a variety of needs and diversities of different display devices, the present invention proposes to employ the time-division display technique so as to provide at least two types of display information onto two different groups of systems and observers. And moreover, the present invention also proposes to use the light source having different polarization directions to emit different polarized light beam. In either way, it is evident that an individual front image and an individual back image are successfully formed and thus can be further applied to smart public transportation systems for providing different info (for example, outward advertisements and inward routes), such that applicability of the present invention can be significantly improved and various demands in different industries are satisfied.

Therefore, based on at least one embodiment provided above, it is believed that, when compared to the prior arts, it is obvious that the thin film display structure disclosed by the present invention is not only characterized by providing dual-sided images, but also effective in avoiding the interferences between the images. As a result, superior image quality and resolution are ensured, when compared with the existing methodology, whereby the present invention successfully solves the conventional problems occurring in the prior arts. It is believed that a great ratio of the stray lights can be reduced for an even optimal inventive effect of the present invention.

It is still worth emphasizing that overall, it is believed that for people who are skilled in the art and having understandings and technical backgrounds to the present invention, it would be allowed for them to make various modifications or changes depending on different device requirements and/or specifications without departing from the scope of the invention. That is to say, the present invention is certainly not limited thereto.

And yet furthermore, according to the dual-sided imaging thin film display structure disclosed by the present invention, it can also be widely applied to display devices that are not limited to use LED as its light source. The present invention can be applied in a variety of technical fields other than the light-emitting diodes. The present invention is not limited thereto.

As a result, to sum above, it is obvious that the present invention apparently shows much more effective performances than before. In addition, it is believed that the present invention is instinct, effective and highly competitive for technologies and industries in the market nowadays, whereby having extraordinary availability and competitiveness for future industrial developments and being in condition for early allowance.

It will be apparent to those skilled in the art that various modifications and variations can be made to the present invention without departing from the scope or spirit of the invention. In view of the foregoing, it is intended that the present invention cover modifications and variations of this invention provided they fall within the scope of the invention and its equivalent.

What is claimed is:

1. A dual-sided imaging thin film display structure, comprising:
a light source, including a front surface and a back surface which is opposite to the front surface;
a reflective polarizing element, being disposed on the front surface of the light source;
a basing layer, being disposed on the back surface of the light source and including a substrate and at least one trace configuration layer; and
a linear polarizing element, being disposed behind the basing layer, wherein a transmission axis of the reflective polarizing element and that of the linear polarizing element are orthogonal, such that a light beam emitted from the light source passes through the reflective polarizing element to form a front image, be reflected by the reflective polarizing element, and passes through the linear polarizing element to form a back image.

2. The dual-sided imaging thin film display structure according to claim 1, wherein the at least one trace configuration layer is disposed on an upper surface of the substrate, such that the at least one trace configuration layer is configured between the light source and the substrate.

3. The dual-sided imaging thin film display structure according to claim 1, wherein the at least one trace configuration layer is disposed on a lower surface of the substrate, such that the at least one trace configuration layer is configured between the substrate and the linear polarizing element.

4. The dual-sided imaging thin film display structure according to claim 1, wherein the at least one trace configuration layer of the basing layer comprises a first trace configuration layer and a second trace configuration layer, which are respectively disposed on an upper surface of the substrate and on a lower surface of the substrate, such that the first trace configuration layer is configured between the light source and the substrate, and the second trace configuration layer is configured between the substrate and the linear polarizing element.

5. The dual-sided imaging thin film display structure according to claim 1, wherein the light source comprises a plurality of light-emitting diodes (LED) for emitting the light beam, the light beam includes a first polarization direction and a second polarization direction, the first polarization direction and the second polarization direction are orthogonal, and the plurality of light-emitting diodes switch the first polarization direction and the second polarization direction alternatively.

6. The dual-sided imaging thin film display structure according to claim 5, wherein when the reflective polarizing element permits the light beam in the first polarization direction to pass through, the front image is formed by the light beam in the first polarization direction.

7. The dual-sided imaging thin film display structure according to claim 6, wherein the back image is formed by the light beam in the second polarization direction.

8. The dual-sided imaging thin film display structure according to claim 5, wherein when the reflective polarizing element permits the light beam in the second polarization direction to pass through, the front image is formed by the light beam in the second polarization direction.

9. The dual-sided imaging thin film display structure according to claim 8, wherein the back image is formed by the light beam in the first polarization direction.

10. The dual-sided imaging thin film display structure according to claim 5, wherein the light beam emitted from the light source firstly passes through the reflective polarizing element to form the front image, subsequently the light beam is reflected by the reflective polarizing element and then passes through the linear polarizing element to form the back image, such that a time difference is generated between forming the front image and forming the back image.

11. The dual-sided imaging thin film display structure according to claim 10, wherein when a frame rate of the front image and the back image is greater than 120 frames per second, the time difference is less than 0.008 second.

12. The dual-sided imaging thin film display structure according to claim 5, wherein when the light beam in the first polarization direction is S-polarized light, the light beam in the second polarization direction is P-polarized light, or wherein when the light beam in the first polarization direction is P-polarized light, the light beam in the second polarization direction is S-polarized light.

13. The dual-sided imaging thin film display structure according to claim 1, wherein the light source comprises a plurality of light-emitting diodes (LED) composed of a first group of light-emitting diodes and a second group of light-emitting diodes, the light beam emitted from the first group of light-emitting diodes is in a first polarization direction, the light beam emitted from the second group of light-emitting diodes is in a second polarization direction, and the first polarization direction and the second polarization direction are orthogonal.

14. The dual-sided imaging thin film display structure according to claim 13, wherein the first group of light-emitting diodes and the second group of light-emitting diodes are turned on simultaneously, such that the front image is formed by the light beam in the first polarization direction and the back image is formed by the light beam in the second polarization direction.

15. The dual-sided imaging thin film display structure according to claim 14, wherein the front image and the back image are formed simultaneously, such that no time difference is generated between forming the front image and forming the back image.

16. The dual-sided imaging thin film display structure according to claim 13, wherein when the light beam in the first polarization direction is S-polarized light, the light beam in the second polarization direction is P-polarized light, or wherein when the light beam in the first polarization direction is P-polarized light, the light beam in the second polarization direction is S-polarized light.

17. The dual-sided imaging thin film display structure according to claim 13, wherein either the first group of light-emitting diodes or the second group of light-emitting diodes is turned on, such that either the front image or the back image is formed.

18. The dual-sided imaging thin film display structure according to claim 17, wherein when only the first group of light-emitting diodes is turned on and the reflective polarizing element permits the light beam in the first polarization direction to pass through, the front image is formed by the light beam in the first polarization direction.

19. The dual-sided imaging thin film display structure according to claim 17, wherein when only the first group of light-emitting diodes is turned on and yet the reflective polarizing element only permits the light beam in the second polarization direction to pass through, then the light beam in the first polarization direction contributes to form the back image.

20. The dual-sided imaging thin film display structure according to claim 17, wherein when only the second group of light-emitting diodes is turned on and the reflective polarizing element permits the light beam in the second polarization direction to pass through, the front image is formed by the light beam in the second polarization direction.

21. The dual-sided imaging thin film display structure according to claim 17, wherein when only the second group of light-emitting diodes is turned on and yet the reflective polarizing element only permits the light beam in the first polarization direction to pass through, then the light beam in the second polarization direction contributes to form the back image.

22. The dual-sided imaging thin film display structure according to claim 1, wherein the at least one trace configuration layer provides electrical power or data input to the light source, and the at least one trace configuration layer comprises a plurality of wires, and the plurality of wires are made of metal or non-metal.

* * * * *